(12) United States Patent
DeBartolo, Jr. et al.

(10) Patent No.: US 9,720,244 B1
(45) Date of Patent: Aug. 1, 2017

(54) INTENSITY DISTRIBUTION MANAGEMENT SYSTEM AND METHOD IN PIXEL IMAGING

(75) Inventors: Joseph V. DeBartolo, Jr., Battle Ground, WA (US); Scott Karlsen, Battle Ground, WA (US); Rob Martinsen, West Linn, OR (US); Jay Small, Salmon Creek, WA (US)

(73) Assignee: nLIGHT, Inc., Vancouver, WA (US)

( * ) Notice: Subject to any disclaimer, the term of this patent is extended or adjusted under 35 U.S.C. 154(b) by 1589 days.

(21) Appl. No.: 13/250,686

(22) Filed: Sep. 30, 2011

(51) Int. Cl.
*G02B 27/20* (2006.01)

(52) U.S. Cl.
CPC .................................... *G02B 27/20* (2013.01)

(58) Field of Classification Search
CPC ................................................... G02B 27/20
USPC ............. 362/259; 355/74, 71; 430/200, 322; 219/121.61, 121.76
See application file for complete search history.

(56) References Cited

U.S. PATENT DOCUMENTS

| | | | |
|---|---|---|---|
| 3,748,015 A | 7/1973 | Offner | |
| 3,773,404 A | 11/1973 | Moore | |
| 4,293,186 A | 10/1981 | Offner | |
| 4,377,339 A * | 3/1983 | Coppock | 355/27 |
| 4,492,427 A | 1/1985 | Lewis et al. | |
| 4,536,639 A | 8/1985 | Crahay | |
| 4,688,904 A | 8/1987 | Hirose et al. | |
| 4,711,535 A | 12/1987 | Shafer | |
| 4,932,747 A | 6/1990 | Russell et al. | |
| 5,153,773 A * | 10/1992 | Muraki et al. | 359/619 |
| 5,224,200 A | 6/1993 | Rasmussen et al. | |
| 5,517,359 A * | 5/1996 | Gelbart | 359/623 |
| 5,586,132 A | 12/1996 | Levy | |

(Continued)

FOREIGN PATENT DOCUMENTS

| | | |
|---|---|---|
| JP | 05-277776 | 10/1993 |
| JP | 2000-343257 | 12/2000 |

(Continued)

OTHER PUBLICATIONS

Erdmann, et al., "Coherence management for microlens laser beam homogenizers," Proceedings of SPIE, 4775:145-154 (2002).

(Continued)

*Primary Examiner* — Anh Mai
*Assistant Examiner* — Matthew Peerce
(74) *Attorney, Agent, or Firm* — Klarquist Sparkman, LLP

(57) ABSTRACT

An intensity distribution management system includes a light source, a mask for receiving light therefrom and for allowing some light to propagate through and past the mask, a surface for receiving light allowed past the mask, and a diffusive element disposed between the mask and the light source for ensuring a substantially even light intensity distribution in relation to the surface. An imaging method includes emitting a light beam, manipulating the beam to have a first numerical aperture across a first divergence axis, directing the beam through a diffusive element to increase the numerical aperture of the beam, directing the beam through one or more transmissive portions of a mask, the mask being disposed relative to the diffusive element, and imaging transmitted portions of the beam to a target surface wherein the beam has a substantially ripple-free and uniform intensity distribution across the first divergence axis at the target surface.

37 Claims, 3 Drawing Sheets

(56) References Cited

U.S. PATENT DOCUMENTS

| | | | |
|---|---|---|---|
| 5,619,245 A * | 4/1997 | Kessler et al. | 347/241 |
| 5,638,220 A | 6/1997 | Ohtomo et al. | |
| 5,673,135 A | 9/1997 | Yoshino | |
| 5,719,704 A * | 2/1998 | Shiraishi et al. | 359/558 |
| 5,936,761 A | 8/1999 | Kubota et al. | |
| 6,040,553 A | 3/2000 | Ross | |
| 6,114,088 A | 9/2000 | Wolk et al. | |
| 6,169,565 B1 * | 1/2001 | Ramanujan | B41J 2/465 347/238 |
| 6,498,680 B1 | 12/2002 | Zhou | |
| 6,509,547 B1 | 1/2003 | Bernstein et al. | |
| 6,529,542 B1 | 3/2003 | Karlsen et al. | |
| 6,531,681 B1 | 3/2003 | Markle et al. | |
| 6,560,039 B1 | 5/2003 | Webb et al. | |
| 6,618,174 B2 * | 9/2003 | Parker et al. | 359/15 |
| 6,678,308 B1 | 1/2004 | Matthews | |
| 6,707,532 B2 | 3/2004 | Suzuki | |
| 6,873,398 B2 * | 3/2005 | Sievers | 355/47 |
| 6,980,295 B2 | 12/2005 | Lerner | |
| 6,985,226 B2 | 1/2006 | Lerner | |
| 7,006,217 B2 | 2/2006 | Lerner | |
| 7,158,215 B2 | 1/2007 | Harned | |
| 7,167,630 B2 | 1/2007 | Eyal et al. | |
| 7,253,376 B2 | 8/2007 | Zhang et al. | |
| RE39,846 E * | 9/2007 | Tanitsu et al. | 355/67 |
| 7,277,229 B2 | 10/2007 | Kato | |
| 7,293,882 B2 | 11/2007 | Lerner | |
| 7,317,469 B2 * | 1/2008 | Kim et al. | 347/224 |
| 7,355,800 B2 | 4/2008 | Anikitchev | |
| 7,418,172 B2 | 8/2008 | Tanaka et al. | |
| 7,502,537 B2 | 3/2009 | Kurahashi | |
| 7,519,493 B2 | 4/2009 | Atwell et al. | |
| 7,545,403 B2 * | 6/2009 | Kang et al. | 347/241 |
| 7,545,446 B2 | 6/2009 | Lerner et al. | |
| 7,704,666 B2 * | 4/2010 | Noh et al. | 430/200 |
| 7,745,991 B2 | 6/2010 | Yamazaki et al. | |
| 7,776,493 B2 | 8/2010 | Kang et al. | |
| 7,792,249 B2 | 9/2010 | Gertner et al. | |
| 7,821,718 B1 | 10/2010 | Govyadinov et al. | |
| 7,847,940 B2 * | 12/2010 | Karasyuk et al. | 356/402 |
| 7,851,725 B2 | 12/2010 | Dane et al. | |
| 7,885,012 B2 * | 2/2011 | Reynolds | 359/668 |
| 7,892,382 B2 | 2/2011 | Bellmann et al. | |
| 7,970,040 B1 | 6/2011 | Sprangle | |
| 7,995,298 B2 * | 8/2011 | Chen | 359/831 |
| 8,062,986 B2 | 11/2011 | Khrapko et al. | |
| 8,483,533 B1 | 7/2013 | Mehl | |
| 8,821,963 B2 * | 9/2014 | Tanaka et al. | 427/66 |
| 2003/0016450 A1 | 1/2003 | Bluemel et al. | |
| 2003/0128543 A1 * | 7/2003 | Rekow | 362/259 |
| 2003/0202251 A1 | 10/2003 | Yamazaki | |
| 2003/0226834 A1 | 12/2003 | Ishikawa | |
| 2004/0036961 A1 | 2/2004 | McGuire | |
| 2004/0065646 A1 | 4/2004 | Halpin | |
| 2004/0090609 A1 | 5/2004 | Komatsuda | |
| 2004/0223330 A1 * | 11/2004 | Broude et al. | 362/268 |
| 2005/0045604 A1 | 3/2005 | Talwar et al. | |
| 2005/0098260 A1 | 5/2005 | Chen | |
| 2006/0012842 A1 | 1/2006 | Abu-Ageel | |
| 2006/0102605 A1 | 5/2006 | Adams et al. | |
| 2006/0176912 A1 | 8/2006 | Anikitchev | |
| 2006/0246693 A1 * | 11/2006 | Tanaka et al. | 438/487 |
| 2007/0063226 A1 | 3/2007 | Tanaka et al. | |
| 2007/0084837 A1 | 4/2007 | Kosmowski | |
| 2007/0147065 A1 * | 6/2007 | Nagata | 362/553 |
| 2007/0153847 A1 | 7/2007 | Faircloth et al. | |
| 2008/0025732 A1 | 1/2008 | Hattori | |
| 2008/0210671 A1 | 9/2008 | Jennings et al. | |
| 2008/0268201 A1 | 10/2008 | Fiacco et al. | |
| 2008/0308534 A1 | 12/2008 | Li et al. | |
| 2009/0046923 A1 | 2/2009 | Chang et al. | |
| 2009/0127477 A1 * | 5/2009 | Tanaka | 250/492.22 |
| 2009/0219491 A1 * | 9/2009 | Williams et al. | 353/37 |
| 2009/0236495 A1 | 9/2009 | Jennings et al. | |
| 2009/0296751 A1 | 12/2009 | Kewitsch et al. | |
| 2010/0048036 A1 | 2/2010 | Tanaka et al. | |
| 2010/0097680 A1 | 4/2010 | Naftali et al. | |
| 2010/0140478 A1 | 6/2010 | Wilson et al. | |
| 2010/0171931 A1 * | 7/2010 | Kessler et al. | 353/31 |
| 2010/0254717 A1 | 10/2010 | Miller | |
| 2011/0043900 A1 | 2/2011 | Bayramian | |
| 2012/0045169 A1 | 2/2012 | Hu | |
| 2012/0057345 A1 * | 3/2012 | Kuchibhotla | G02B 27/0961 362/237 |
| 2012/0069861 A1 | 3/2012 | Neuberger | |
| 2012/0248078 A1 | 10/2012 | Zediker et al. | |
| 2012/0268836 A1 | 10/2012 | Mercado | |
| 2012/0273269 A1 | 11/2012 | Rinzler et al. | |
| 2013/0058092 A1 * | 3/2013 | Anisimov | 362/259 |
| 2013/0107360 A1 | 5/2013 | Kurtz et al. | |

FOREIGN PATENT DOCUMENTS

| | | |
|---|---|---|
| JP | 2006-278491 | 10/2006 |
| WO | WO 2011/142849 | 11/2011 |

OTHER PUBLICATIONS

International Search Report and Written Opinion for International Application No. PCT/US2013/033424, 9 pages, mailed Jul. 18, 2013.

Positive Light, Inc. "Relay Imaging in Rod Amplifier Systems," Technical Bulletin, 2 pages, (May 2002).

Schmitt et al., "Illumination uniformity of laserfusion pellets using induced spatial incoherence," Journal of Applied Physics, 60:6-13 (Jul. 1, 1986).

French et al., "Absorption Edge and Band Gap of SiO2 Fused Silica Glass," Ceramic Transactions, 28:63-80. (1992).

Summary of First Office Action from the State Intellectual Property Office of the People's Republic of China for Chinese App. No. 201380012279.9, mailed Oct. 26, 2015, 4 pages.

* cited by examiner

INTENSITY DISTRIBUTION MANAGEMENT SYSTEM AND METHOD IN PIXEL IMAGING

BACKGROUND OF THE INVENTION

1. Field of the Invention

Generally, the field of the present invention is laser patterning. More particularly, the present invention relates to an intensity distribution management system and method in the imaging of pixels on a mask.

2. Background

Laser systems have enjoyed application to a variety of fields for many years. As transistor and display technologies have advanced over the past few decades, transistor sizes have decreased and LED light outputs have increased, both at logarithmic rates. Laser systems, and their application to the manufacturing processes of semiconductor electroluminescent materials, have allowed the continued advancement in these areas. For example, laser systems form an important part of selective thermal transfer processes, such as laser induced thermal imaging (LITI) enjoying successful application in the flat panel display industry.

However, obstacles have persisted that prevent an effective and repeatable thermal imaging process. One such obstacle has been in the attempts to maintain a uniform intensity of laser light focused at the surface targeted in the imaging process. Thus, despite efforts to achieve a uniform imaging process that is also low cost and with minimal complexity, there remains a need for systems and methods without these attendant drawbacks.

SUMMARY OF THE INVENTION

According to one aspect of the present invention, an intensity distribution management system includes a light source, such as a laser light source, and a mask for receiving light from the light source and for allowing portions of light to propagate through and past the mask. The system also includes a target surface for receiving light allowed past the mask. A diffusive element is disposed relative to the mask so that light propagating through and past the mask has a substantially even or uniform intensity distribution when incident on the targeted surface.

In another aspect of the invention, an intensity distribution management method includes emitting a light beam from a light source such as a laser light source, optically manipulating the light beam emitted from the light source so that the light beam has a first numerical aperture, directing the light beam through a diffusive element so as to increase the first numerical aperture to a second numerical aperture, directing the light beam through one or more transmissive portions of a mask wherein the mask is disposed relative to the diffusive element, and imaging transmitted portions of the light beam to a target surface wherein the light beam has a substantially ripple-free and uniform intensity distribution across the first divergence axis at the target surface.

The foregoing and other objects, features, and advantages will become more apparent from the following detailed description, which proceeds with reference to the accompanying figures.

DETAILED DESCRIPTION OF THE INVENTION

Figure 1:
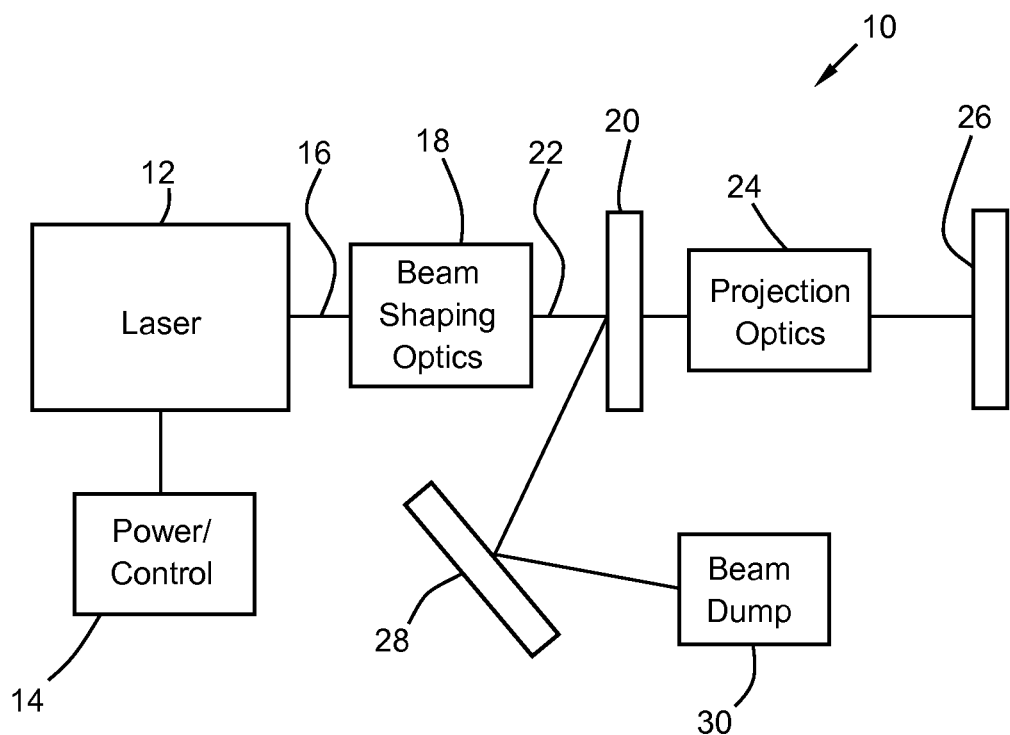
FIG. 1 is a block diagram of a prior art laser system for laser patterning.

Referring now to FIG. 1, a prior art laser system 10 for laser patterning is shown. Such a laser system 10 includes a light source, here in the form of a laser 12 which may be of various configurations, including pulsed or continuous wave, and in various packages, such as laser diode modules housing a plurality of laser emitters instead of just a single emitter or housing laser diode bars. In some embodiments, laser system 10 is a line generator while in others laser system 10 is capable of producing another output shape besides circular. The laser 12 is in communication with a power/control source 14 and may optionally be pumped with other lasers. The laser beam or beams 16 (hereinafter beam) emitted from the laser 12 are directed towards beam shaping optics 18 which homogenize the transverse intensity distribution across one or more axes and direct the beam 16 along a path 22. In some embodiments the divergences across the one or more orthogonal axes of the beam 16 may be different from each other. The beam 16 is then incident on a mask 20 disposed along the beam path 22. After mask 20, the beam 16 propagates through projection optics 24, such as a projection lens, before impinging on a target surface 26. The beam 16 or the surface 26, or both, are translatable for alignment purposes as well as for process purposes. The beam 16 incident on the mask 20 propagates through transmissive portions 50 (see FIG. 4) thereof. The transmissive portions may be of various shapes including rectangular, circular, and other patterns. Optical elements 28 may also be disposed in relation to the mask 20 so as to direct portions of beam 16 not transmitted through the mask 20 to a beam dump 30.

One application for a laser system 10 is laser induced thermal imaging (LITI) wherein the surface 26 is selectively targeted with the laser beam 16 such that thermal imaging can occur. A variety of surfaces may be targeted, though typically under this technique laser beams are selectively directed to a donor film comprised of a base film, a light to heat conversion layer, and a transfer layer, such as an electroluminescent layer made of small molecules or light emitting polymer. Ultra fast heating caused by the selected incidence of laser radiation on the donor film transfers the electroluminescent layer onto to an adjacent substrate. Such selective material transfer is used for pixel formation in various display technologies, such as organic LED manufacture, and is achievable with lasers having high accuracy and precision.

To effect a superior transfer several parameters must be carefully controlled and designed around. For example, the mask 20 and projection optics 24 must be finely matched such that the desired image is achieved at target surface 26.

Figure 2:
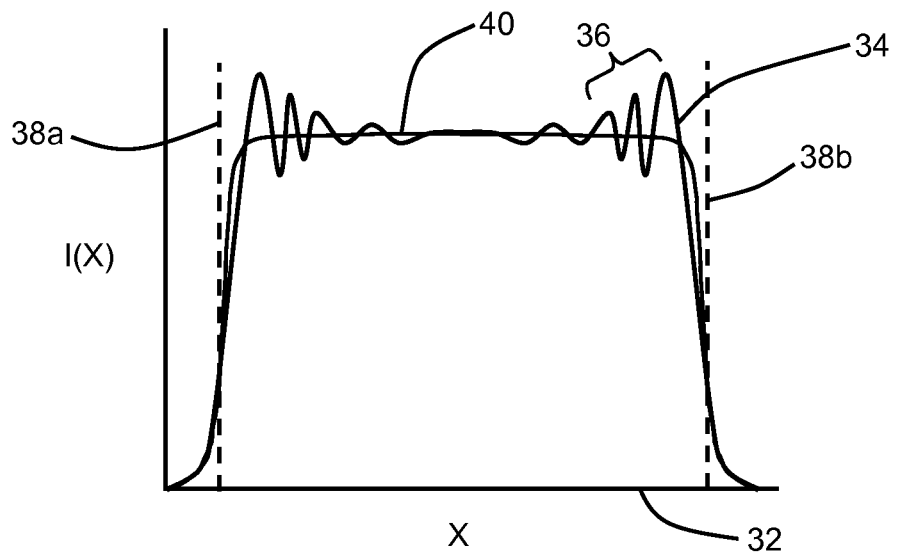
FIG. 2 is a chart of intensity distribution along a low divergence transverse axis of a laser beam incident on a target surface.

Also, the thickness and composition of the donor layers must be selected to achieve adhesion between the respective layers and cohesion of the transfer layer such that suitable transfer of the electroluminescent layer on the substrate is the result. Thus, the incident laser radiation should have a generally uniform spatial luminous intensity distribution across at least one orthogonal axis such that pixels imaged at one location due to the mask will be similarly imaged at other locations. Thus, as will be further described herein, another important area of consideration is the degree of consistency of the luminous intensity distribution delivered to the targeted LITI surface. For example, a typical intensity distribution 34 for laser system 10 is shown in FIG. 2. As can be seen therein, across a low divergence axis 32 the intensity of electromagnetic radiation 34 at the target surface 26, i.e., transmitted through the mask 20, has ripples 36 near the edges 38a, 38b. In view of the presence of the ripples 36 the system 10 of FIG. 1 is unsatisfactory in terms of intensity distribution management.

Figure 3:
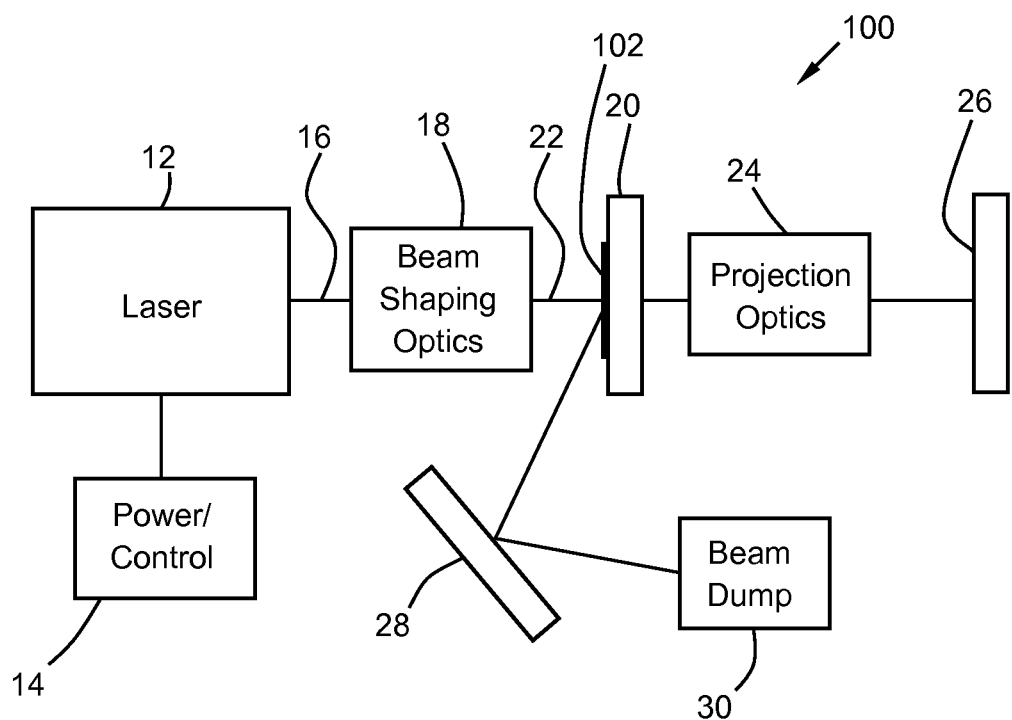
FIG. 3 is a block diagram of a laser system for pixel imaging according to an aspect of the present invention.

Referring to FIG. 3, in an exemplary embodiment of the present invention, a laser system 100 is shown that may include many of the same components shown in FIG. 1 and hereinbefore described. That is, a laser or lasers 12 are in communication with a power/control source 14. A laser beam 16 is generated and directed to beam shaping optics 18 which homogenize the transverse intensity distribution across one or more orthogonal axes. The beam 16 is incident on a mask 20 disposed along a beam path 22. After mask 20, the beam 16 propagates through projection optics 24, such as a projection lens, before impinging on a target surface 26. The beam 16 or the surface 26, or both, may be translatable for alignment purposes as well as for process purposes. The beam 16 incident on the mask 20 propagates through transmissive portions thereof. Optical elements 28 may also be disposed in relation to the mask 20 so as to direct portions of beam 16 not transmitted through the mask 20 to a beam dump 30.

As mentioned before the beam shaping optics 18 homogenize the intensity distribution of the beam 16. This is useful when a plurality of laser beams, such as a bar of laser diode emitters or an array of single emitter diodes, fiber-coupled or otherwise, is used as the laser source 12. As shown in FIG. 2, even with a laser beam 16 having a substantially uniform intensity distribution across one orthogonal axis is incident on the mask 20, a distribution 34 is seen incident on the target surface 26 across the same axis that includes ripples 36 towards the edges 38a, 38b of targeted area on the surface 26. The ripples 36 are undesirable since they represent spatial variation in intensity distribution of portions of the laser beam 16 transmitted through the mask 20 and incident on the target surface 26. For well controlled and repeatable laser induced thermal imaging such that predictable mechanisms are observed in and between donor film and substrate, an even and predictable intensity distribution of the beam incident on the surface 26, such as the flat distribution 40 shown in FIG. 2, is desirable.

Figure 4:
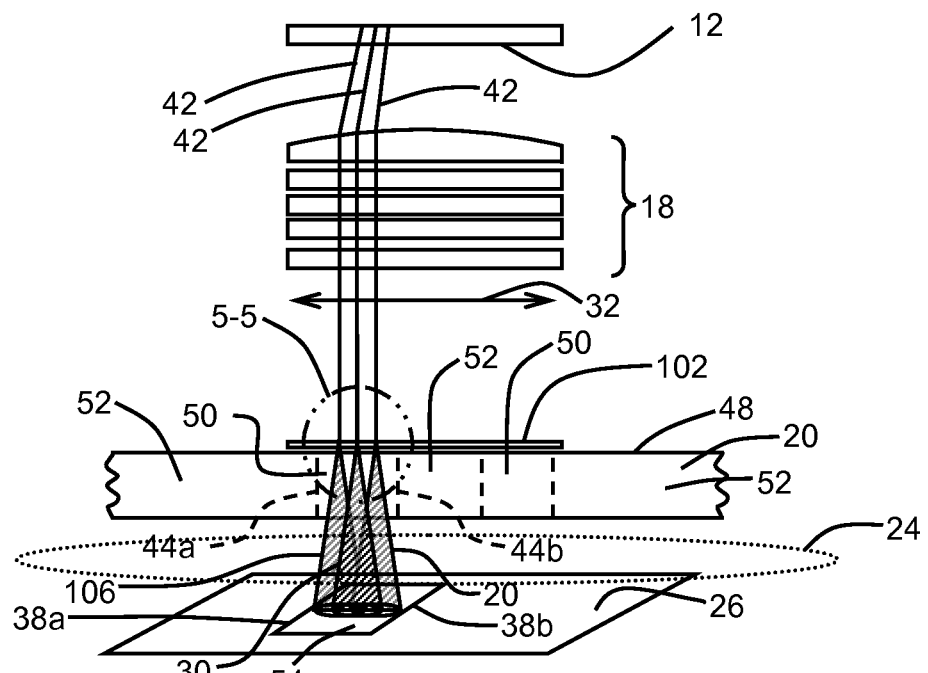
FIG. 4 is a side view of a mask and accompanying diffusive element according to an aspect of the present invention.

Accordingly, the inventors herein have developed an intensity distribution management system and method in accordance with the present invention to flatten out or eliminate ripples 36, as seen in FIG. 2, near the edges 38a, 38b at target surface 26. Referring now to FIGS. 3 and 4, in an exemplary embodiment of the present invention, in the laser system 100 for pixel imaging, a diffusive element 102 to enable intensity distribution management is shown disposed adjacent to and in front of mask 20. The diffusive element 102 may be of any suitable type, such as a diffractive optical element, a lens array diffuser, or a refractive lens array. A diffusive element with fine pitch lenslets is suitable, as well as diffusive elements causing diffusion in one dimension. Other diffusive elements may be used as well, and the listing here of particular element types is not by way of limitation. By the inclusion of diffusive element 102, the convergence angle of light propagating through and past the mask 20 is increased. The beams 106 propagating through and past the diffuser 102 are characterized by a reduced spatial coherence and result in an averaging of multiple different diffraction ripple patterns 36. This multiple averaging causes the beam propagating past the mask 20 pattern to become incident on the target surface 26 in a more uniform way such that a flatter intensity distribution 40 is applied.

Figure 5:
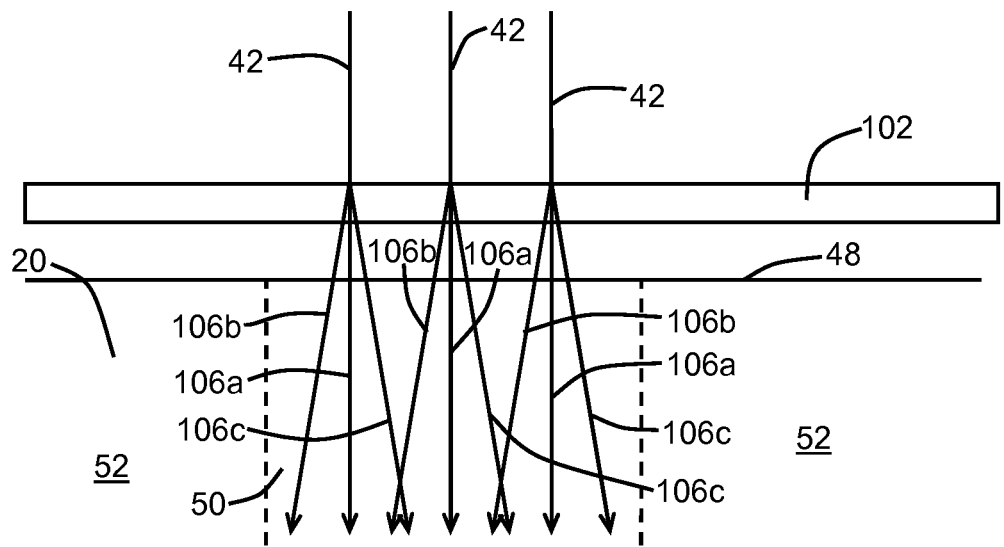
FIG. 5 is a zoomed-in side view of a mask and accompanying diffusive element according to an aspect of the present invention.

A more detailed side view of beam shaping optics 18 and mask 20 is shown in FIGS. 4 and 5. In FIG. 4, exemplary component beams 42 of beam 16 propagate from the laser 12 through the beam shaping optics 18 and are significantly collimated towards the mask 20. In some embodiments, coatings are applied to the surface 48 of the mask 20 so as to allow light to propagate through some regions 50 and not through other regions 52. The transmissive regions 50 allow the laser beam 16 to be incident on predetermined portions 54 of target surface 26. While the diffusive element 102 shown in FIG. 5 is spaced apart from the mask surface 48, in some embodiments the diffusive element 102 is attached or formed on the mask 20.

The incident component beams 42 typically have a low divergence of approximately 0.01 NA across axis 32 and a larger divergence of approximately 0.1 NA across a transverse axis 56. By propagating through the diffusive element 102, the component beams 42 expand somewhat to form component beams 106 having a larger NA across low divergence axis 32. As seen in closer detail in FIG. 5, each component beam 106 can be thought to have respective principal rays 106a and marginal rays 106b, 106c. Component beams 106b form a beam with different propagation angles than component beams 106a and 106c. Multiple propagation angles cause different aperture diffraction patterns with different intensity ripples with the cumulative effect of a smoothing of the ripples 36.

Figure 6:
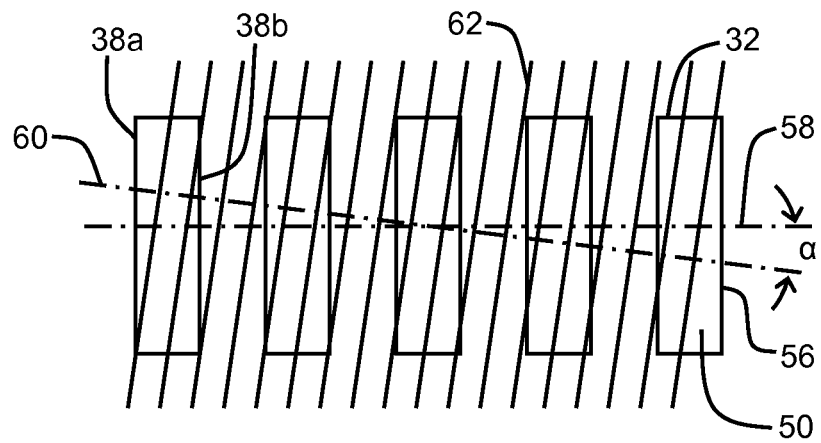
FIG. 6 is a plan view of a mask and accompanying diffusive element according to an aspect of the present invention.

In another embodiment, shown in FIG. 6, the principle axis 60 of a one-dimensional diffuser 102, having line representations 62, is angularly displaced by an angle α in relation to a principle axis 58 of mask 20 or respective transmissive portions 50 thereof. Suitable angles may be between 0° and 5° and preferably about 3°. The slight angle change a causes an unexpected increased smoothing or reduction of intensity ripples 36 such that a more uniform intensity distribution is incident on the target surface 26. In other embodiments the angular displacement may have a different angular range greater or less than 0 to 5, though for one-dimensional diffusers generally, the result is an effect on beam properties in the transverse axis 32. By the addition of element 102 in both angled and perpendicular embodiments disposed relative to the mask 20, the width of the beam 16 emitted from the laser 12 can remain within reasonable limits and aperture diffraction effects can be limited. Moreover, the beam shaping optics 18 can remain relatively simple and inexpensive. In some embodiments, the diffusive element 102 is an isotropic diffuser, such as one made with ground glass, providing diffusive effects in two dimensions instead of one.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. An intensity distribution management system comprising:
    a light source situated to produce a light beam;
    a beam shaping system situated to receive the light beam and to produce a substantially uniform homogenized line beam propagating along an optical axis having a line axis orthogonal to the optical axis and a thickness axis mutually orthogonal to the optical axis and line axis, the homogenized line beam having a homogenized intensity profile along the line axis;
    a mask situated perpendicular to the optical axis so as to receive the substantially uniform homogenized line beam and to transmit selected portions of the homogenized line beam to propagate through said mask so as to be received by a target surface; and
    a diffusive element disposed between said mask and said beam shaping system so as to attenuate intensity ripples in a light intensity distribution of the selected portions at the target surface that are associated with the transmission of the selected portions through said mask.

2. The system of claim 1, wherein said light source is a laser source comprising one or more laser diode modules that include laser diode bars or single-emitter diodes.

3. The system of claim 2, wherein the line axis corresponds to a slowly diverging slow axis of the laser diode bars or single-emitter diodes and the thickness axis corresponds to a rapidly diverging fast axis of the laser diode bars or single-emitter diodes.

4. The system of claim 1 wherein the target surface is a laser induced thermal imaging target surface.

5. The system of claim 1 wherein said light source and beam shaping system comprise a line generator.

6. The system of claim 1, wherein the homogenized line beam received by the mask has different divergences with respect to the line axis and the thickness axis.

7. The system of claim 1, wherein said diffusive element and said mask are angularly displaced with respect to each other at an oblique angle so as to reduce aperture diffraction effects.

8. The system of claim 1 wherein said diffusive element is an isotropic diffuser.

9. The system of claim 1 wherein said diffusive element is a one dimensional diffusive element.

10. The system of claim 1, wherein said diffusive element and said mask are angularly displaced with respect to each other by an angle of greater than zero and less than or equal to five degrees.

11. The system of claim 1, wherein the homogenized line beam has a first numerical aperture with respect to the line axis as incident to said diffusive element and a second numerical aperture with respect to the line axis upon exiting said diffusive element wherein the second numerical aperture is greater than the first numerical aperture.

12. The system of claim 11 wherein said first numerical aperture is approximately 0.01.

13. The system of claim 1, wherein the mask is an opaque mask including opaque and non-opaque portions.

14. The system of claim 1, wherein the mask includes transmissive portions situated to transmit the selected portions of the homogenized line beam and non-transmissive portions situated to block unselected portions of the homogenized line beam so that the unselected portions do not propagate to the target surface.

15. The system of claim 1, wherein the selected portions of the homogenized line beam at the target surface form an image of transmissive portions of the mask that transmit the selected portions of the homogenized line beam through the mask.

16. The system of claim 1, wherein the diffusive element is attached to or formed on the mask.

17. An intensity distribution management method comprising:
    emitting a light beam from a light source;
    homogenizing the light beam so as to form a substantially uniform homogenized light beam;
    changing a numerical aperture of said substantially uniform homogenized light beam to a first beam numerical aperture across a first divergence axis;
    directing said substantially uniform homogenized light beam through a diffusive element so as to increase said first beam numerical aperture to a second beam numerical aperture across the first divergence axis;
    directing said substantially uniform homogenized light beam with the second beam numerical aperture through one or more transmissive portions of a mask, said mask being disposed relative to said diffusive element; and
    imaging transmitted portions of said substantially uniform homogenized light beam at a target surface so that said transmitted portions have a substantially uniform intensity distribution across said first divergence axis at said target surface with a reduced ripple intensity variation due to transmission through said diffusive element.

18. The method of claim 17 wherein said light source is a laser source.

19. The method of claim 18 wherein said laser source comprises one or more laser diode modules.

20. The method of claim 19 wherein said laser diode modules are laser diode bars or single-emitter based modules.

21. The method of claim 17 wherein said target surface is one used for laser induced thermal imaging.

22. The method of claim 17 wherein said light source is a line generator.

23. The method of claim 17, wherein the substantially uniform homogenized light beam as received by the diffusive element has a third beam numerical aperture across a divergence axis orthogonal to the first divergence axis and wherein the substantially uniform homogenized light beam as received by the mask has approximately the same third numerical aperture across the divergence axis orthogonal to the first divergence axis.

24. The method of claim 17 wherein said light source includes beam shaping optics.

25. The method of claim 17, wherein said diffusive element and said mask are angularly displaced with respect to each other at an oblique angle in order to minimize aperture diffraction effects.

26. The method of claim 17 wherein said diffusive element is an isotropic diffuser.

27. The method of claim 17 wherein said diffusive element is a one dimensional diffusive element.

28. The method of claim 17, wherein said diffusive element and said mask are angularly displaced with respect to each other by an angle of greater than zero and less than or equal to five degrees.

29. The method of claim 17, wherein said first beam numerical aperture is approximately 0.01.

30. The method of claim 17, further comprising blocking one or more portions of the substantially uniform homogenized light beam with one or more opaque portions of the mask.

31. The method of claim 17, wherein the imaged transmitted portions form an image of the transmissive portions of the mask.

32. An apparatus, comprising:
a light source situated to generate one or more beams;
a beam shaping system situated to receive the one or more beams and to generate a substantially uniform homogenized beam;
a mask situated to receive the substantially uniform homogenized output beam and to transmit selected portions of the substantially uniform homogenized beam to a target surface and to block other selected portions of the substantially uniform homogenized beam; and
a diffusive element situated between the mask and the beam shaping system to adjust a light intensity distribution of the transmitted selected portions of the substantially uniform homogenized beam at the target surface.

33. The apparatus of claim 32, wherein the mask has transmissive portions situated to transmit the selected portions and the shape of the transmissive portions is imaged at the target surface.

34. A system comprising:
a light source situated to produce a light beam;
a beam shaping system situated to receive the light beam and to produce a homogenized line beam propagating along an optical axis having a line axis orthogonal to the optical axis and a thickness axis mutually orthogonal to the optical axis and line axis, the homogenized line beam having a homogenized intensity profile along the line axis;
a mask situated perpendicular to the optical axis so as to receive the homogenized line beam and to transmit selected portions of the homogenized line beam to propagate through the mask so as to be received by a target surface; and
a diffusive element disposed between the mask and the beam shaping system and angularly displaced with respect to the mask at an oblique angle so as to attenuate intensity ripples in a light intensity distribution of the selected portions at the target surface that are associated with the transmission of the selected portions through the mask and so as to reduce aperture diffraction effects.

35. A system comprising:
a light source situated to produce a light beam;
a beam shaping system situated to receive the light beam and to produce a homogenized line beam propagating along an optical axis having a line axis orthogonal to the optical axis and a thickness axis mutually orthogonal to the optical axis and line axis, the homogenized line beam having a homogenized intensity profile along the line axis;
a mask situated perpendicular to the optical axis so as to receive the homogenized line beam and to transmit selected portions of the homogenized line beam to propagate through the mask so as to be received by a target surface; and
a diffusive element that includes at least one isotropic diffuser disposed between the mask and the beam shaping system so as to attenuate intensity ripples in a light intensity distribution of the selected portions at the target surface that are associated with the transmission of the selected portions through the mask.

36. A system comprising:
a light source situated to produce a light beam;
a beam shaping system situated to receive the light beam and to produce a homogenized line beam propagating along an optical axis having a line axis orthogonal to the optical axis and a thickness axis mutually orthogonal to the optical axis and line axis, the homogenized line beam having a homogenized intensity profile along the line axis;
a mask situated perpendicular to the optical axis so as to receive the homogenized line beam and to transmit selected portions of the homogenized line beam to propagate through the mask so as to be received by a target surface; and
a diffusive element disposed between the mask and the beam shaping system so as to attenuate intensity ripples in a light intensity distribution of the selected portions at the target surface that are associated with the transmission of the selected portions through the mask;
wherein the diffusive element and the mask are angularly displaced with respect to each other by an angle of greater than zero and less than or equal to five degrees.

37. A system comprising:
a laser source including one or more laser diode modules each including laser diode bars or single-emitter diodes, the laser source situated to produce a laser beam;
a beam shaping system situated to receive the laser beam and to produce a homogenized line beam propagating along an optical axis and having a line axis that is orthogonal to the optical axis and that corresponds to a slowly diverging slow axis of the laser diode bars or single-emitter diodes and having a thickness axis mutually orthogonal to the optical axis and line axis and that corresponds to a rapidly diverging fast axis of the laser diode bars or single-emitter diodes, the homogenized line beam having a homogenized intensity profile along the line axis;
a mask situated perpendicular to the optical axis so as to receive the homogenized line beam and to transmit selected portions of the homogenized line beam to propagate through the mask so as to be received by a target surface; and
a diffusive element disposed between the mask and the beam shaping system so as to attenuate intensity ripples in a light intensity distribution of the selected portions at the target surface that are associated with the transmission of the selected portions through the mask.

* * * * *